United States Patent [19]

Oinoue et al.

[11] Patent Number: 4,733,067
[45] Date of Patent: Mar. 22, 1988

[54] SEMICONDUCTOR LASER APPARATUS FOR OPTICAL HEAD

[75] Inventors: Hiroshi Oinoue, Tokyo; Akira Nakamura, Kanagawa, both of Japan

[73] Assignee: Sony Corporation, Tokyo, Japan

[21] Appl. No.: 853,210

[22] Filed: Apr. 17, 1986

[30] Foreign Application Priority Data

Apr. 22, 1985 [JP] Japan .................................. 60-86178
Apr. 22, 1985 [JP] Japan .................................. 60-86179

[51] Int. Cl.$^4$ ............................................. H01J 3/14
[52] U.S. Cl. ................................. 250/216; 250/211 J; 357/19
[58] Field of Search ............... 250/201, 204, 216, 578, 250/211 J, 551; 357/19; 369/44–46, 112, 122

[56] References Cited

U.S. PATENT DOCUMENTS

| 3,941,945 | 3/1976 | Borner et al. | 369/122 |
| 4,284,884 | 8/1981 | Dyment et al. | 357/19 |
| 4,293,826 | 10/1981 | Scifres et al. | 357/19 |
| 4,334,300 | 6/1982 | Arquie et al. | 357/19 |
| 4,338,577 | 7/1982 | Sato et al. | 357/19 |
| 4,541,084 | 9/1985 | Oku et al. | 250/201 |
| 4,626,679 | 12/1986 | Kuwayama et al. | 250/201 |

Primary Examiner—David C. Nelms
Attorney, Agent, or Firm—Hill, Van Santen, Steadman & Simpson

[57] ABSTRACT

In a semiconductor laser apparatus for an optical head, a beam splitter having a first surface incline at a predetermined angle with respect to a radiant surface of a semiconductor laser chip is fixed on a photodetector to reduce the cost of the optical head.

5 Claims, 16 Drawing Figures

SEMICONDUCTOR LASER APPARATUS FOR OPTICAL HEAD

BACKGROUND OF THE INVENTION

1. Field of the Invention

The present invention relates to a semiconductor laser apparatus for an optical head for performing beam radiation and incident beam detection.

2. Description of the Prior Art

An optical head used in an optical recording/reproducing system or the like irradiates an optical recording medium with a beam, and detects a modulated beam from the optical recording medium to perform information recording/reproducing.

Figure 1:
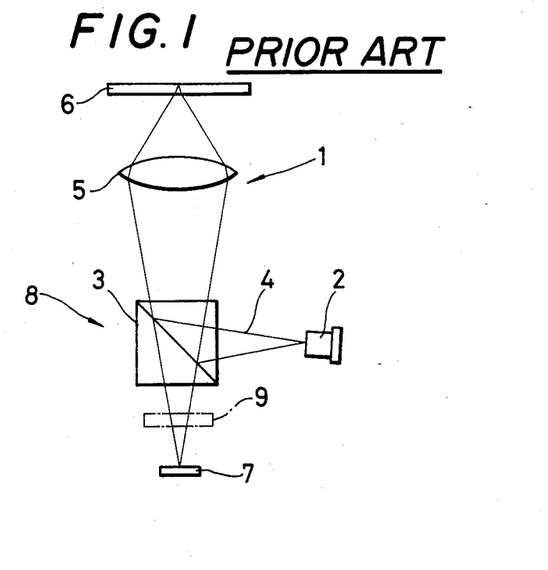
FIG. 1 is a side view of an optical head using a conventional semiconductor laser apparatus.

The optical head normally uses a semiconductor laser apparatus. FIG. 1 shows an optical head using a typical conventional semiconductor laser apparatus.

In an optical head 1, a beam 4 radiated from a semiconductor laser 2 and reflected by a beam splitter 3 is incident on an optical recording medium 6 through an objective lens 5. The beam 4, reflected by the optical recording medium 6 and passing through the objective lens 5 and the beam splitter 3, is incident on a photodetector 7.

In the optical head 1, the semiconductor laser 2, the beam splitter 3 and the photodetector 7 constitute a semiconductor laser apparatus 8.

In the conventional semiconductor laser apparatus 8, positional adjustment of the three separate optical components results in a high cost for the optical head 1.

In addition, the optical head scans the optical recording medium without contact, so focus servo control is required. An astigmatism method is largely used as a method of detecting a focus error. In this case, since a cylindrical lens 9 is normally arranged between the beam splitter 3 and the photodetector 7, the above problem becomes even more severe.

SUMMARY OF THE INVENTION

In a semiconductor laser apparatus for an optical head according to the present invention, a beam splitter having a first surface inclined at a predetermined angle with respect to a radiant surface of a semiconductor laser chip is fixed on a photodetector. The beam splitter and the photodetector thus constitute an integral optical component.

Positional adjustment of the components of the semiconductor laser apparatus during assembly can be reduced to decrease the cost of the optical head.

BRIEF DESCRIPTION OF THE DRAWINGS

FIGS. 2 to 14 show embodiments of the present invention, in which

DETAILED DESCRIPTION OF THE PREFERRED EMBODIMENTS

The first to sixth embodiments of the present invention will be described with reference to FIGS. 2 to 14.

Figure 2:
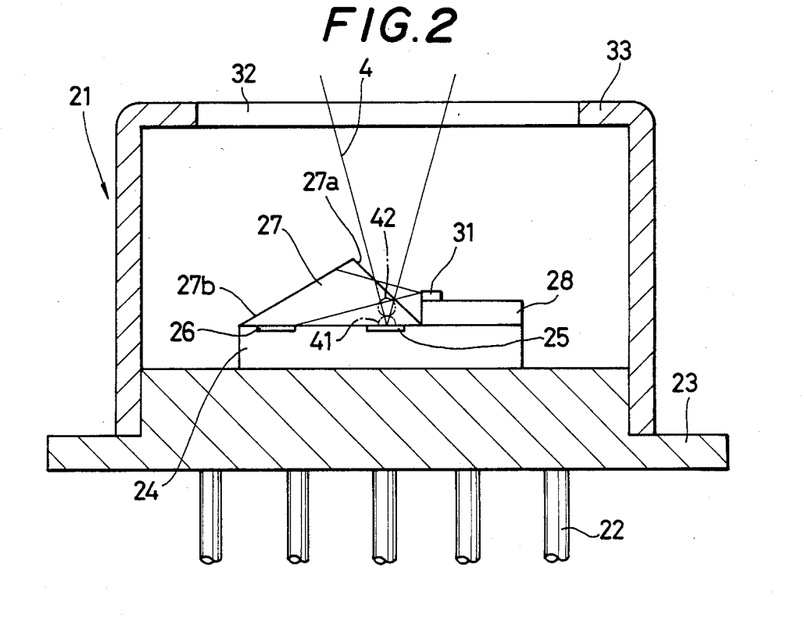
FIG. 2 is a side sectional view of a semiconductor laser apparatus according to a first embodiment.
Figure 3:
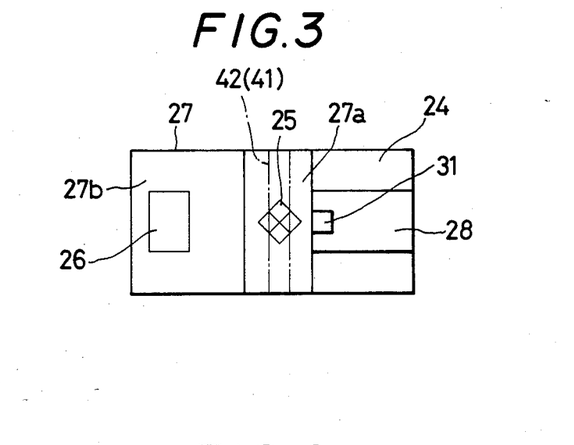
FIG. 3 is a plan view showing a main part of the first embodiment.

FIGS. 2 and 3 show the first embodiment of the present invention. In a semiconductor laser apparatus 21 of the first embodiment, a silicon substrate 24 is fixed on a stem 23 with leads 22. A PIN diode 25 as a signal detecting photodetector and a PIN diode 26 as a laser output monitoring photodetector are formed on the silicon substrate 24.

A triangular prism 27 is fixed with an adhesive to the silicon substrate 24 to cover the PIN diodes 25 and 26. Another silicon substrate 28 is fixed on the silicon substrate 24 next to the triangular prism 27. A laser diode chip 31 as a semiconductor laser is arranged at the edge of the silicon substrate 28 beside the triangular prism 27. An inclined surface 27a of the triangular prism 27 opposite the laser diode chip 31 has a reflectivity of about 50%. Another inclined surface 27b has a totally reflective coating, i.e., a reflectivity of 100%.

A cap 33 with a window glass 32 is mounted on the stem 23 to hermetically seal the above-mentioned optical system. It should be noted that the PIN diodes 25 and 26 and the laser diode chip 31 are connected to the leads 22 by wires (not shown).

Figure 4:
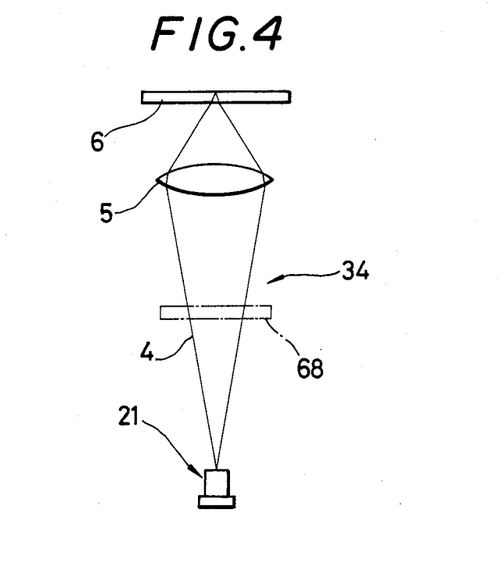
FIG. 4 is a side view of an optical head employing the first embodiment.

FIG. 4 shows an optical head 34 employing the semiconductor laser apparatus 21. In the optical head 34, a beam 4 radiated from the laser diode chip 31 and reflected by the inclined surface 27a of the triangular prism 27 is transmitted through the window glass 32 and an objective lens 5 and is incident on an optical recording medium 6.

The beam 4 reflected by the optical recording medium 6 and transmitted through the window glass 32 and the inclined surface 27a is incident on the PIN diode 25.

In this case, the beam 4 reflected by the optical recording medium 6 is incident on the inclined surface 27a in a converged state. There is a difference between the refractive indices of the triangular prism 27 and air. For this reason, the beam 4 is subjected to astigmatism and is incident on the PIN diode 25.

Figure 5A:
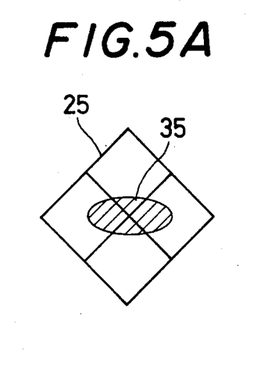
FIGS. 5A, 5B and 5C are plan views showing beam spots on a photodetector.
Figure 5B:
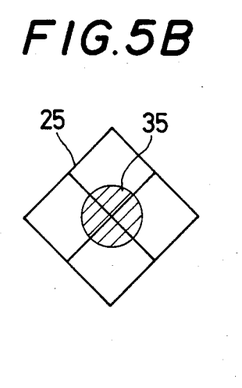
Figure 5C:
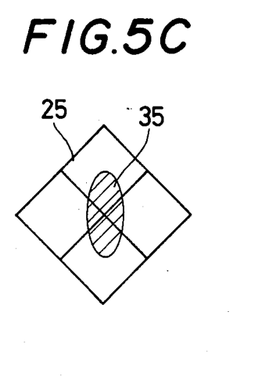

Assume that the positional relationship between the laser diode chip 31 and the PIN diode 25 is determined such that a beam spot 35 of the beam incident on the PIN diode 25 in a focused state is of the shape shown in FIG. 5B. A beam spot 35 having the shape shown in FIG. 5A or 5C is then formed on the PIN diode 25 in accordance with its displacement from the focused state.

As is apparent from FIG. 3, the PIN diode 25 consists of four photodetecting portions A to D divided by two bisectors inclined at 45° in opposite directions with respect to the ridge of the triangular prism 27.

Figure 6:
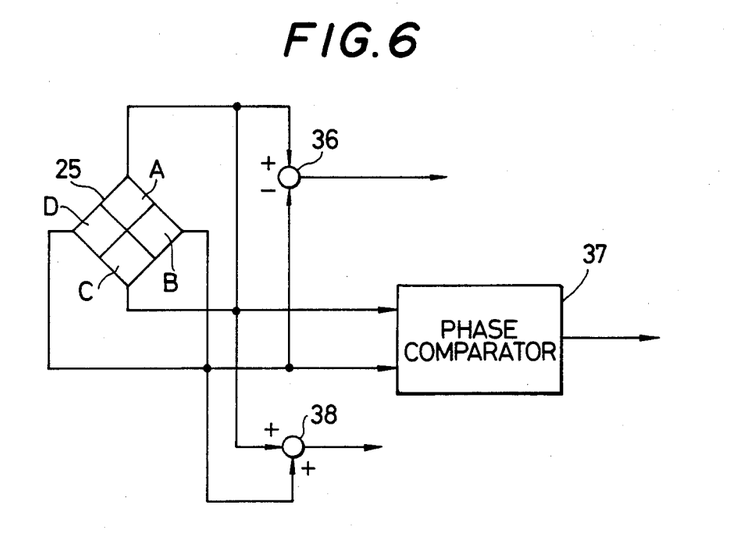
FIG. 6 is a block diagram of a circuit for the optical head shown in FIG. 4.

When a circuit in FIG. 6 is used, a focus error signal (A+C)−(B+D) can be output from a subtracter 36 for receiving signals from the four photodetecting portions A to D constituting the PIN diode 25, and a tracking error signal and a reproduced signal A+B+C+D can be output from a phase comparator 37 and an adder 38, respectively.

When a sufficient astigmatism effect cannot be obtained from the refractive index difference between the triangular prism 27 and air, part of the triangular prism 27 is removed as indicated by the alternate long and short dashed lines in FIGS. 2 and 3 to constitute a cylindrical lens portion 41 or 42.

In the semiconductor laser apparatus 21 of the first embodiment, as shown in FIG. 2, the beam 4 radiated from the laser diode chip 31 is transmitted through the inclined surface 27a of the triangular prism 27 and is incident on the PIN diode 26 either directly or after being reflected by the inclined surface 27b. Therefore, the output from the laser diode chip 31 can be adjusted on the basis of the output from the PIN diode 26.

In the semiconductor laser apparatus 21 of the first embodiment, the beam 4 radiated from the laser diode chip 31 and reflected by the inclined surface 27a of the triangular prism 27 does not directly return to the laser diode chip 31. For this reason, little noise is generated by the laser diode chip 31.

Furthermore, since the single triangular prism 27 serves as a beam splitter, the semiconductor laser apparatus 21 is inexpensive.

Since the PIN diodes 25 and 26 are formed on the same surface of the single silicon substrate 24, the PIN diodes 25 and 26 can be simultaneously formed by a lithographic technique.

Figure 7:
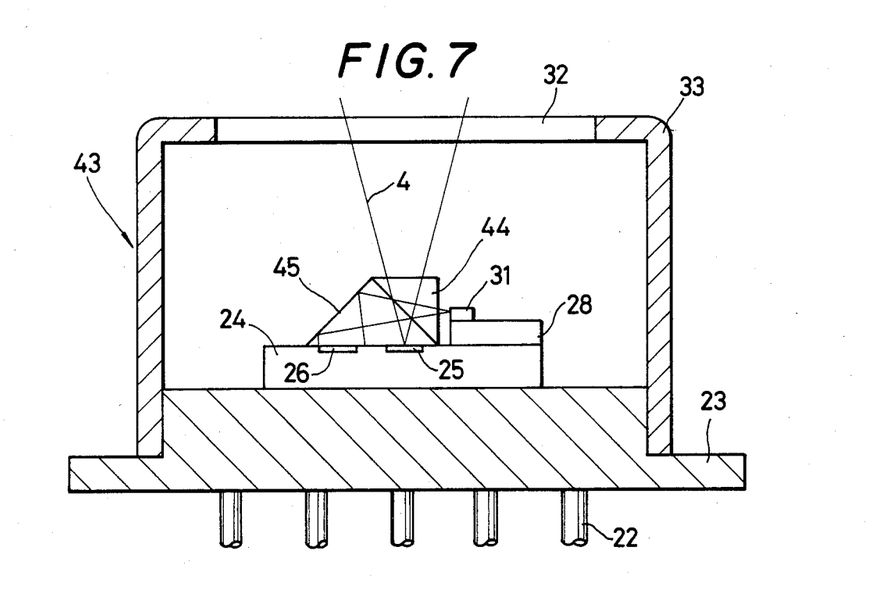
FIG. 7 is a side sectional view of a second embodiment.

FIG. 7 shows a second embodiment of the present invention. A semiconductor laser apparatus 43 of the second embodiment is substantially the same as that of the first embodiment (FIG. 2), except that a beam splitter is constituted by two rectangular prisms 44 and 45 having different refractive indices.

Figure 8:
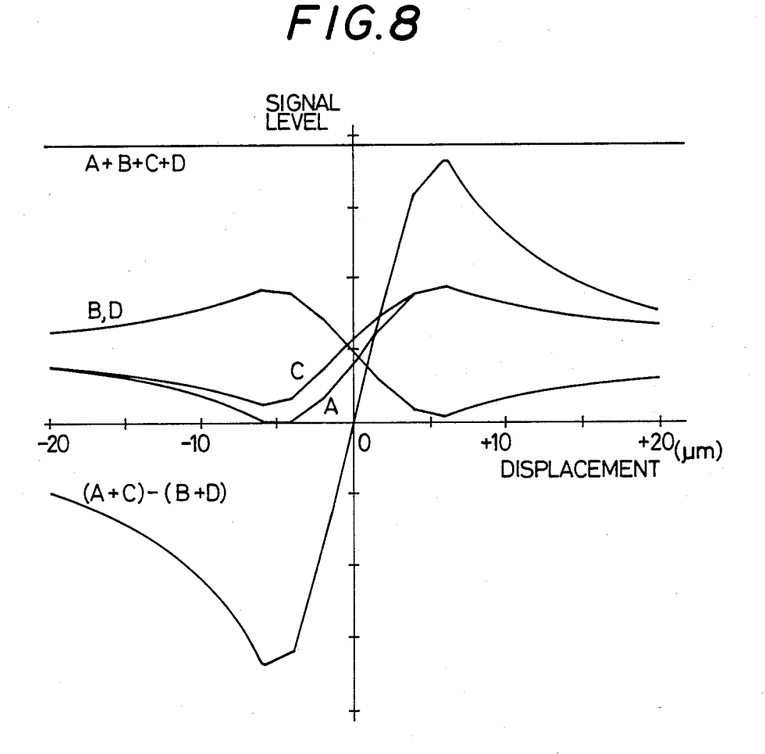
FIG. 8 is a chart showing signals from an optical head employing the second embodiment.

FIG. 8 shows levels of signals from the PIN diode 25 when the semiconductor laser apparatus 43 of the second embodiment is used in an optical head upon displacement of an optical recording medium 6 along the optical axis of a beam 4. The rectangular prisms 44 and 45 constituting a 1-mm high beam splitter are of optical glass BK7 and SF11, the NA of the objective lens 5 is 0.47, and the NA of a collimator lens (not shown in FIG. 4) is 0.14.

Figure 9:
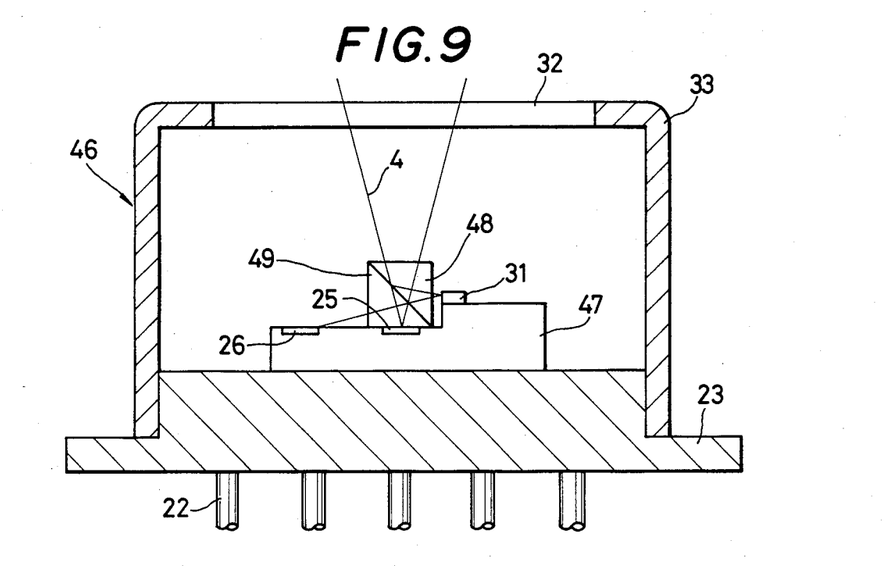
FIGS. 9, 10, 11 and 12 are respectively side sectional views of semiconductor laser apparatuses according to third to sixth embodiments of the present invention.

FIG. 9 shows a third embodiment of the present invention. A semiconductor laser apparatus 46 of the third embodiment is substantially the same as that of the first embodiment (FIG. 2), except that PIN diodes 25 and 26 and a laser diode chip 31 are formed on an integral silicon substrate 47, and a beam splitter constituted by two rectangular prisms 48 and 49 having refractive indices different from each other is fixed on the silicon substrate 47 at a position above only a PIN diode 25.

Figure 10:
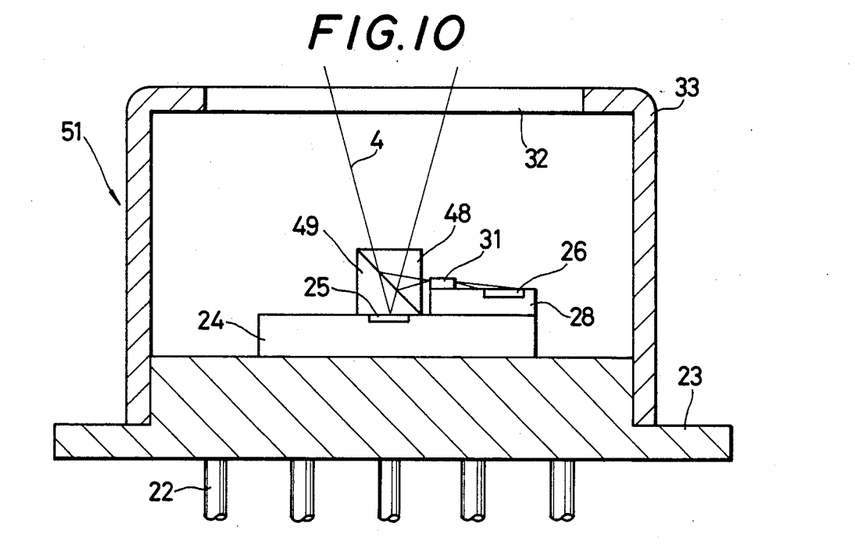

FIG. 10 shows a fourth embodiment of the present invention. A semiconductor laser apparatus 51 of the fourth embodiment is substantially the same as that of the third embodiment (FIG. 9), except that a silicon substrate 28 is formed on a silicon substrate 24, and a laser output monitoring PIN diode 26 is formed in the silicon substrate 28 having a laser diode chip 31 thereon.

In the semiconductor laser apparatus 51 of the fourth embodiment, the PIN diode 26 serves as a back monitor element of the laser diode chip 31.

Figure 11:
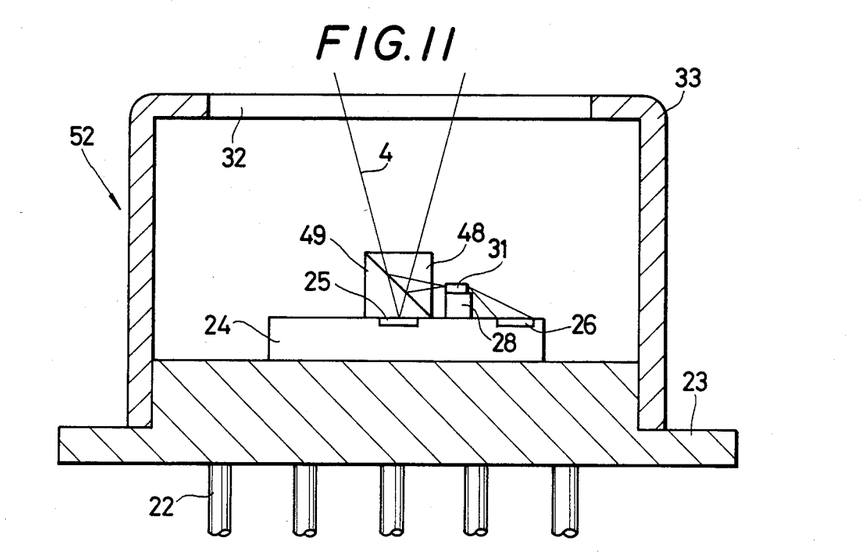

FIG. 11 shows a fifth embodiment of the present invention. A semiconductor laser apparatus 52 of the fifth embodiment is substantially the same as that of the fourth embodiment (FIG. 10), except that a PIN diode 26 is formed on a silicon substrate 24 having a PIN diode 25 thereon.

Figure 12:
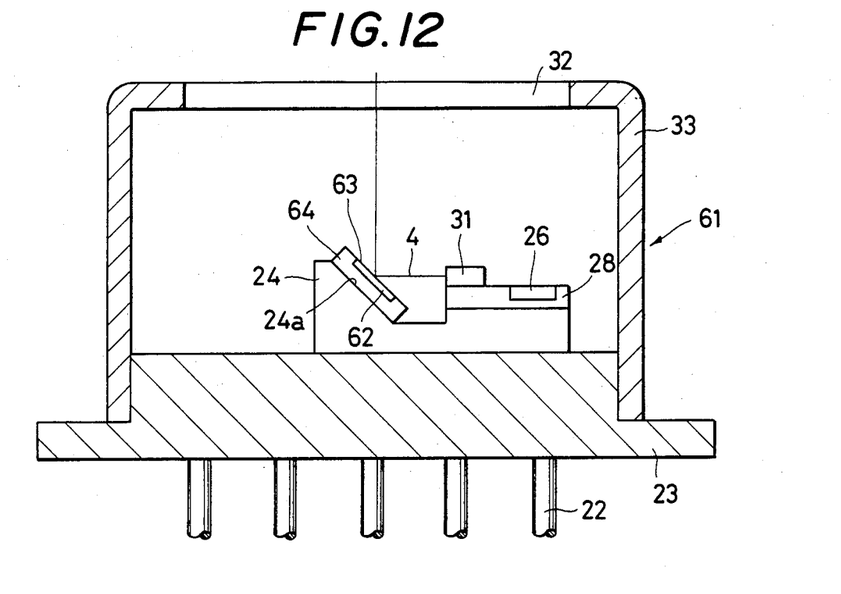

FIG. 12 shows a sixth embodiment of the present invention. A semiconductor laser apparatus 61 of the sixth embodiment is substantially the same as that of the fourth embodiment (FIG. 10), except that a substrate 24 has a surface 24a inclined with respect to a radiant surface of a laser diode chip 31, and a silicon substrate 64, having thereon a signal detecting PIN diode 62 and a thin film 63 with transmittance and reflectivity of 50%, is fixed to the surface 24a.

If the substrate 24 comprises a silicon substrate, the inclined surface 24a can be formed at an inclination angle of 54.7° by etching. Alternatively, if the substrate 24 comprises a metal substrate, the inclined surface 24a can be machined at an inclination angle of 45°. The silicon substrate 64 can be fixed on either inclined surface 24a.

The semiconductor laser apparatus 61 of the sixth embodiment can be used in place of the semiconductor laser apparatus 21 in the optical head 34 in FIG. 4. In the optical head 34 with the semiconductor laser apparatus 61, a beam 4 radiated from the laser diode chip 31 and reflected by the thin film 63 is transmitted through a window glass 32 and an objective lens 5. The transmitted beam 4 is then incident on an optical recording medium 6.

The beam 4 reflected by the optical recording medium 6 and transmitted through the window glass 32 and the thin film 63 is incident on the PIN diode 62. In this case, the thin film 63 serves as a beam splitter.

Figure 13:
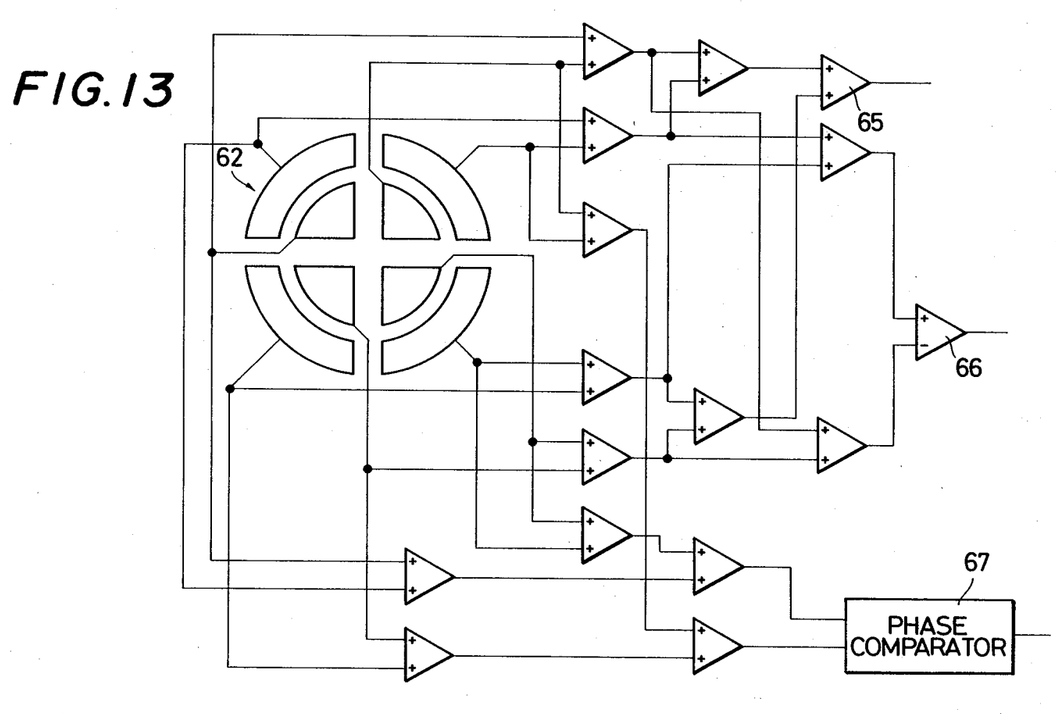
FIG. 13 is a block diagram showing a circuit for the optical head shown in FIG. 12.

When a circuit in FIG. 13 is used, a reproduced signal, a focus error signal and a tracking error signal can be output from an adder 65, a subtracter 66 and a phase comparator 67, respectively.

The beams incident on the PIN diode 62 include the beam 4 reflected and modulated by the optical recording medium 6 and the beam 4 transmitted through the thin film 63 as soon as it is radiated from the laser diode chip 31.

Figure 14:
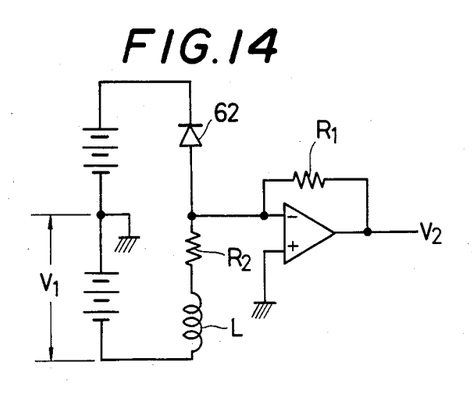
FIG. 14 is a circuit diagram of a current-to-voltage converter used in the sixth embodiment.

FIG. 14 shows a technique using a current-to-voltage converter for electrically extracting a signal level of the beam 4 directly incident from the laser diode chip 31 onto the PIN diode 62.

If a photocurrent from direct beam incidence and a photocurrent from the return beam are given as I1 and I2, respectively, the PIN diode 62 generates a photocurrent of I1+I2. An output voltage V2 from the converter is given as follows:

$$V2 = -(I1 + I2) \cdot R1 + V1 \cdot (R1/R2)$$
$$= -(I1 + I2 - V1/R2) \cdot R1$$

The photocurrent I1 consists of a DC component. If R2=V1/I1, then V2=−I2.R1, thereby eliminating the influence of the photocurrent I1. A coil L prevents a high-frequency signal component of the photocurrent I2 from being shunted at the side of resistor R2.

In order to prevent direct incidence from the laser diode chip 31 onto the PIN diode 62, the film 63 comprises a polarizing film instead of a semitransmitting film. At the same time, as indicated by the alternate long and short dashed line in FIG. 4, a ¼ wave plate 68 may be inserted between the semiconductor laser apparatus 61 and the objective lens 5.

With this arrangement, an S-polarized beam 4 from the laser diode chip 31 is totally reflected by the thin film 63 and transmitted through the ¼ wave plate 68, thereby obtaining a circularly polarized beam. The beam modulated by and returning from the optical recording medium 6 is transmitted through the ¼ wave plate 68 and is polarized as a P-polarized beam. The P-polarized beam is entirely transmitted through the thin film 63.

If the substrate 24 comprises a silicon substrate, the substrate 24 and the silicon substrate 28 can be integrally formed. In addition, the silicon substrate 64 can also be formed integrally with the resultant bulk substrate.

What is claimed is:

1. A semiconductor laser aparatus for use for an optical head having a stem, a substrate mounted on said stem, a semiconductor laser chip provided on said substrate, photodetector means and a cap with a window glass mounted on said stem to hermetically seal said substrate, said laser chip and said photodetector means, comprising: a beam splitter attached to said substrate and having a first surface inclined at a predetermined angle with respect to a radiant surface of said laser chip in order to reflect a beam radiated from said laser chip toward said window glass to thereby direct said beam to an objective lens of an optical head, and said photodetector means formed on said substrate and covered by said beam splitter so as to receive the return beam reflected back through said objective.

2. An apparatus according to claim 1, wherein said photodetector means includes a first photodetector; and the outputs from said first photodetector serves as a reproduced signal.

3. An apparatus according to claim 2, wherein said beam splitter comprises a prism, and said first photodetector comprises four photodetecting portions divided by two bisectors inclined by 45° in directions opposite to a ridge of said beam splitter, two pairs of said photodetecting portions point symmetrical with respect to an intersection of the two bisectors being adapted to generate outputs for deriving a focus error signal, the focus error signal being calculated as an astigmatism from a difference between a sum of the outputs from one pair of opposing photodetecting portions and a sum of the outputs from the other pair of opposing photodetecting portions.

4. An apparatus according to claim 2, wherein said photodetector means further includes a second photodetector, and said beam splitter has a second surface for directing the beam radiated from said semiconductor laser chip partially transmitted through said first surface of said beam splitter toward said second photodetector, so that an output from said semiconductor laser chip is monitored by a signal from said another photodetector.

5. An apparatus according to claim 3, wherein said prism comprises first and second triangular prisms having refractive indices different from each other.

* * * * *